United States Patent [19]

Dickenson

[11] Patent Number: 5,508,476

[45] Date of Patent: Apr. 16, 1996

[54] MOUNTING ARRANGEMENT FOR SEMICONDUCTOR DEVICES

[75] Inventor: Robert J. Dickenson, Lincoln, United Kingdom

[73] Assignee: Plessey Semiconductors Limited, United Kingdom

[21] Appl. No.: 217,505

[22] Filed: Mar. 24, 1994

[30] Foreign Application Priority Data

Apr. 1, 1993 [GB] United Kingdom ............... 9306823

[51] Int. Cl.⁶ .................................................. H05K 1/18
[52] U.S. Cl. .................. 174/261; 174/250; 361/760; 361/748; 439/55; 439/78; 439/83; 439/81
[58] Field of Search ....................... 174/250, 255, 174/261; 361/748, 760; 439/55, 78, 81, 83

[56] References Cited

U.S. PATENT DOCUMENTS

| 3,778,530 | 12/1973 | Reimann | 174/68.5 |
|---|---|---|---|
| 4,634,638 | 1/1987 | Ainslie et al. | 428/671 |
| 4,970,570 | 11/1990 | Agarwala et al. | 357/68 |
| 5,198,885 | 3/1993 | Ibrahim | 257/701 |
| 5,329,160 | 7/1994 | Miura et al. | 257/710 |
| 5,400,489 | 3/1995 | Hegner et al. | 29/25.41 |

FOREIGN PATENT DOCUMENTS

| 2673040 | 8/1992 | France. |
|---|---|---|
| 62-282456 | 12/1987 | Japan. |
| WO92/20100 | 11/1992 | WIPO. |

Primary Examiner—Laura Thomas
Attorney, Agent, or Firm—Kirschstein et al.

[57] ABSTRACT

An arrangement for making fatigue-free external connections to a device mounted on a direct copper bonded substrate, in which one or more connector tubes are brazed to respective copper areas on the substrate before the device is mounted on the substrate, and external connections are made by soldering leads or bus bars into the tubes.

5 Claims, 1 Drawing Sheet

MOUNTING ARRANGEMENT FOR SEMICONDUCTOR DEVICES

BACKGROUND OF THE INVENTION

1. Field of the Invention

The present invention relates to mounting arrangements for semiconductor devices. In particular although not exclusively the invention is concerned with a mounting arrangement, or package, for an insulated gate bipolar transistor (IGBT).

2. Description of the Related Art

Present mounting arrangements for IGBTs until sea direct copper bonded (DCB) alumina substrate, which forms the base of the package as well as providing internal isolation. Other semiconductor devices and/or passive components may be mounted on the substrate, and the component-bearing, or populated, side of the substrate may be enclosed in a case and encapsulated with any of a variety of potting compounds.

Several methods are used for attaching connecting wires or bus-bars to copper areas on the substrate, which then make terminals on the outside of the package or module for the end user, one of which methods is to solder the wires or bus-bars directly to the copper area on the populated side of the substrate. With this method components can be mounted on the substrate and the sub-assembly completed before space-restricting external connections are made, which can be essential if space is limited, as is often the case with this kind of structure.

A problem which arises with such soldered joints is that the thermal expansion rate of the copper layer which forms part of the DCB "sandwich" is modified by the bond to the alumina, and is lower than that of free copper. A copper conductor soldered to the copper layer tends to expand and contract at its normal rate, and this results in fatigue and eventual failure of the solder joint.

SUMMARY OF THE INVENTION

It is an object of the present invention to provide an improved electrical connection to a conductive area on a substrate.

According to one aspect of the present invention a mounting arrangement for one or more semiconductor devices comprises a substrate of electrically insulating material having directly bonded thereon at least one area of electrically conducting material to which a semiconductor device is to be connected, said area of electrically conductive material having brazed thereon an electrically conductive connector member to which an external electrical connection may be soldered.

According to another aspect of the present invention a method of making an electrical connection to a generally laminar conductor formed on a substrate of electrically insulating material, on which substrate one or more semiconductor devices are to be mounted, includes the steps of brazing onto said laminar conductor an electrically conductive connector member, mounting said one or more semiconductor devices on said substrate, and securing an electrical connection to said conductive connector member.

Preferably said connector member takes the form of a short length of tube one end of which is brazed to said laminar conductor. The electrical connection may comprise a wire or strip conductor which is secured to said connector member by soldering.

A mounting arrangement for semiconductor devices providing for electrical connection to the devices by way of conductive areas or layers on an insulating substrate on which the devices are mounted, will now be described by way of example with reference to the accompanying drawing, of which:

DETAILED DESCRIPTION OF THE INVENTION

Figure 1:
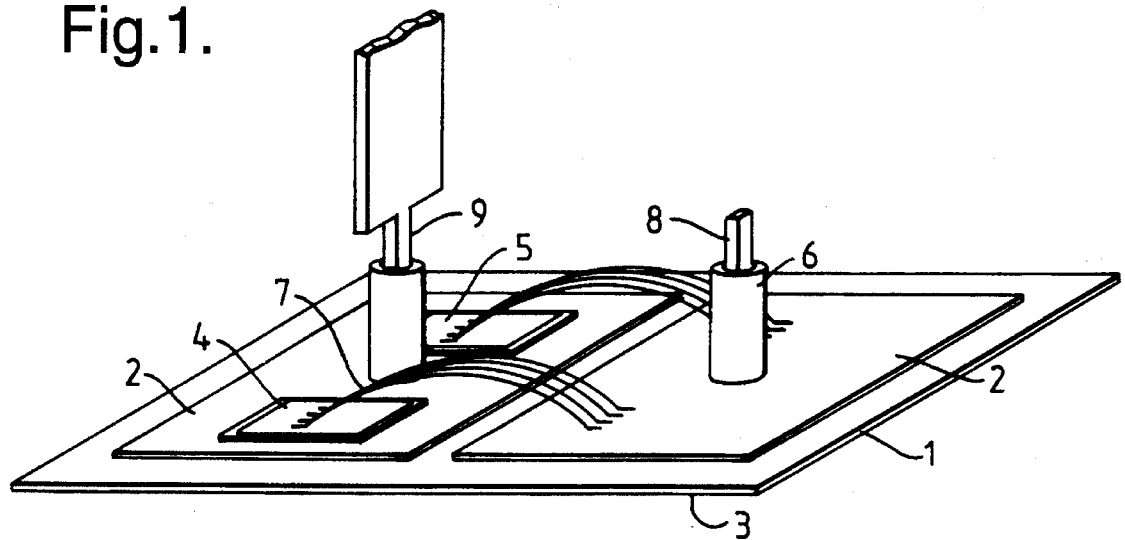
FIG. 1 shows schematically an isometric view of the mounting arrangement.
Figure 2:
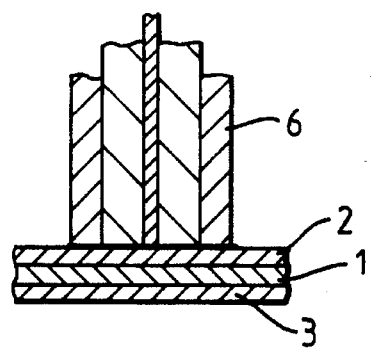
FIG. 2 shows a sectional view of part of the mounting arrangement shown in FIG. 1.

Referring to the drawing a direct copper bonded substrate comprises a thin sheet 1 of alumina having layers of copper 2 and 3 bonded to its upper and lower faces respectively, the layer 2 at least being patterned to suit the connections required to semiconductor devides 4, 5 mounted on the substrate. To prepare for external connections to the devices 4 and 5, short lengths of copper tube 6 are brazed to the copper layer 2 at locations which will not obstruct assembly, the tubes 6 having, say, one end face brazed to the copper layer 2 such that the axis of the tube is perpendicular to the layer 2 as shown or at any convenient angle for making the required external connection.

All assembly operations, such as soldering in place the devices 4 and 5 and making wire bond interconnections 7, are then completed before the assembly space envelope is restricted by the soldering of the wire connections 8 or bus bars 9 into the tubes 6.

The brazed joints between the copper tubes 6 and the copper layers 2 do not fatigue, although it is still expected that the solder will fatigue at its point of contact with the layer 2, the integrity of the connection being maintained through the soldered joint between the walls of the tubes 6 and the connections 8 or bus bars 9.

Because of the temperatures involved, of the order of, say, 780° C. for a silver/copper eutectic, brazed connections can only be made prior to the mounting on the substrate of components such as the semiconductor devices 4 and 5, and this prevents the use of directly brazed connections except where assembly space is not a consideration. The present method combines the strength and freedom from fatigue of brazed joints with the advantage of making the external connections by soldering at a late stage of manufacture, when space over the substrate is no longer required for positioning and mounting the components on the substrate.

It will be appreciated that the method may find uses with different semiconductor devices and substrate materials.

I claim:

1. A mounting arrangement for at least one semiconductor device, comprising: a substrate of electrically insulating material having directly bonded thereon a plurality of areas of electrically conductive material; at least one electrically conductive connector member in the form of a short length of tube brazed directly to one of said areas of electrically conductive material; a semiconductor device mounted on said substrate; soldered connecting means interconnecting said semiconductor device and said one of said areas of electrically conductive material; and electrical conductor means having one end extending within, and soldered directly to, said length of tube to provide an external electrical connection to said semiconductor device.

2. The mounting arrangement in accordance with claim 1, wherein at least a part of said semiconductor device is soldered directly to said one of said areas of electrically conductive material.

3. A method of making an electrical connection to a generally laminar conductor formed on a substrate of electrically insulating material, on which substrate at least one semiconductor device is to be mounted, comprising the steps of: brazing onto said laminar conductor an electrically conductive connector member which takes the form of a short length of tube, one end of which is brazed to said laminar conductor; mounting said at least one semiconductor device on said substrate; and securing an electrical connection to said conductive connector member.

4. The method in accordance with claim 3, wherein said electrical connection comprises a wire which is secured to said connector member by soldering.

5. The method in accordance with claim 3, wherein said electrical connection comprises a strip conductor which is secured to said connector member by soldering.

* * * * *